(12) United States Patent
Bolam et al.

(10) Patent No.: US 7,890,893 B2
(45) Date of Patent: Feb. 15, 2011

(54) DESIGN STRUCTURE FOR SEMICONDUCTOR ON-CHIP REPAIR SCHEME FOR NEGATIVE BIAS TEMPERATURE INSTABILITY

(75) Inventors: Ronald J. Bolam, East Fairfield, VT (US); Tom C. Lee, Essex Junction, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 12/050,990

(22) Filed: Mar. 19, 2008

(65) Prior Publication Data

US 2009/0183131 A1    Jul. 16, 2009

Related U.S. Application Data

(63) Continuation-in-part of application No. 11/971,937, filed on Jan. 10, 2008, now Pat. No. 7,838,958.

(51) Int. Cl.
*G06F 17/50*    (2006.01)
(52) U.S. Cl. .................................. 716/1; 716/2; 716/4
(58) Field of Classification Search ................. 716/1, 716/2, 4
See application file for complete search history.

(56) References Cited

U.S. PATENT DOCUMENTS

| 6,879,177 B1 | 4/2005 | Bolam et al. |
| 7,177,201 B1 | 2/2007 | Takayanagi |

(Continued)

OTHER PUBLICATIONS

Bolam et al., U.S. Appl. No. 11/971,937, Office Action Communication, Sep. 16, 2009, 12 pages.

(Continued)

*Primary Examiner*—Jack Chiang
*Assistant Examiner*—Suchin Parihar
(74) *Attorney, Agent, or Firm*—Gibb I.P. Law Firm, LLC; Richard M. Kotulak, Esq.

(57) ABSTRACT

Disclosed is a design structure for a semiconductor chip structure that incorporates a localized, on-chip, repair scheme for devices that exhibit performance degradation as a result of negative bias temperature instability (NBTI). The repair scheme utilizes a heating element above each device. The heating element is configured so that it can receive transmission line pulses and, thereby generate enough heat to raise the adjacent device to a temperature sufficient to allow for performance recovery. Specifically, high temperatures (e.g., between approximately 300-400° C. or greater) in the absence of bias can accelerate the recovery process to a matter of seconds as opposed to days or months. The heating element can be activated, for example, on demand, according to a pre-set service schedule, and/or in response to feedback from a device performance monitor.

19 Claims, 7 Drawing Sheets

U.S. PATENT DOCUMENTS

| | | | |
|---|---|---|---|
| 7,225,375 B2 * | 5/2007 | Cochran et al. | 714/733 |
| 2005/0151213 A1 | 7/2005 | Casey et al. | |
| 2006/0052905 A1 | 3/2006 | Pfingsten et al. | |
| 2006/0141135 A1 * | 6/2006 | Wang et al. | 427/66 |
| 2006/0282804 A1 * | 12/2006 | Ang et al. | 716/4 |
| 2007/0018678 A1 * | 1/2007 | Puchner et al. | 324/769 |
| 2008/0164936 A1 * | 7/2008 | Rahim et al. | 327/534 |
| 2008/0294379 A1 * | 11/2008 | Kim et al. | 702/182 |
| 2009/0108247 A1 * | 4/2009 | Takaura et al. | 257/2 |
| 2009/0138760 A1 * | 5/2009 | Moreira et al. | 714/32 |
| 2009/0179689 A1 * | 7/2009 | Bolam et al. | 327/513 |
| 2009/0289696 A1 * | 11/2009 | Lewis et al. | 327/534 |
| 2010/0025811 A1 * | 2/2010 | Bronner et al. | 257/528 |
| 2010/0055811 A1 * | 3/2010 | Lin et al. | 438/26 |

OTHER PUBLICATIONS

Bolam et al., U.S. Appl. No. 11/971,937, Office Action Communication, Mar. 25, 2010, 15 pages.

Bolam et al., U.S. Appl. No. 11/971,937, Notice of Allowance and Fee Due, Jul. 13, 2010, 9 pages.

* cited by examiner

DESIGN STRUCTURE FOR SEMICONDUCTOR ON-CHIP REPAIR SCHEME FOR NEGATIVE BIAS TEMPERATURE INSTABILITY

CROSS-REFERENCE TO RELATED APPLICATIONS

This application is a Continuation-In-Part of U.S. application Ser. No. 11/971,937 filed Jan. 10, 2008, the complete disclosure of which, in its entirety, is herein incorporated by reference.

BACKGROUND

1. Field of the Invention

The embodiments of the invention generally relate to on-chip repair of semiconductor devices and, more particularly, to a design structure for semiconductor chip structure and a method that incorporate a localized, on-chip, repair scheme for devices that exhibit performance degradation as a result of negative bias temperature instability (NBTI).

2. Description of the Related Art

Negative bias temperature instability (NBTI) is a phenomenon in which powered-up sub-micron complementary metal oxide semiconductor (CMOS) devices and, more specifically, p-type field effect transistors (PFETs), exhibit performance degradation over time and/or under certain use conditions. This NBTI primarily causes an increase in the PFET threshold voltage and, thereby causes a reduction in the PFET drive current. Consequently, there is a need in the art for semiconductor chip structure and a method that allows for localized, on-chip, repair of devices suffering from NBTI performance degradation.

SUMMARY

In view of the foregoing, disclosed herein is a design structure for a semiconductor chip structure and a method that incorporate a localized, on-chip, repair scheme for devices that exhibit performance degradation as a result of negative bias temperature instability (NBTI). The repair scheme utilizes a heating element above each device. The heating element is configured so that it can receive transmission line pulses and, thereby generate enough heat to raise the adjacent device to a temperature sufficient to allow for performance recovery. Specifically, high temperatures (e.g., between approximately 300-400° C. or greater) in the absence of bias can accelerate the recovery process to a matter of seconds as opposed to days or months. The heating element can be activated, for example, on demand, according to a pre-set service schedule, and/or in response to feedback from a device performance monitor.

An embodiment of a semiconductor chip structure of the present invention comprises a substrate. A semiconductor device (e.g., a PFET) is positioned on the substrate and electrically connected to a first back end of the line (BEOL) wiring level by first contacts. Due to negative bias temperature instability (NBTI), this device is subject to performance degradation away from an optimal performance level.

The repair scheme of the present invention uses a heating element positioned adjacent to the device. This heating element can, for example, comprise a BEOL resistor in the form of a metal or metal alloy layer, such as, a refractory metal or a refractory metal alloy, having a melting temperature that is at least greater than approximately 400° C. This heating element is adapted to receive a current with a predetermined value so as to locally heat the device to a predetermined temperature, which is sufficient to raise the current performance level of the device. To accomplish this, a transmission line pulse device can be coupled to the heating element through a second BEOL wiring level, which is different from the first BEOL wiring level, and through one or more second contacts extending between the second wiring level and the heating element. The transmission line pulse device can be adapted to apply a current in the form of a transmission line pulse to the heating element. Those skilled in the art will recognize that the heating element should be physically separated from the second wiring level by a distance sufficient to minimize heat conduction through the second wiring level. Additionally, the heating element should be electrically isolated from the device itself as well as from the first contacts to the device and the first wiring level.

Activation of the heating element can be manual or automatic. For example, activation of the heating element can be initiated immediately after package production prior to shipment and/or in the field according to a pre-set service schedule. Activation of the heating element can also be initiated, as necessary, based on performance monitoring. Specifically, another embodiment of the semiconductor chip structure can comprise a performance degradation monitor in addition to the features set out above. This performance degradation monitor can be connected to the device and can be adapted to detect the current performance level of the device and further to determine if the current performance level is below a predetermined threshold performance level. The monitor can be in communication with the transmission line pulse device and the transmission line pulse device can further be adapted to apply the current (i.e., the transmission line pulse) to the heating element when the monitor detects that the current performance level is below the predetermined threshold level.

Also disclosed are embodiments of an associated method for the on-chip repair of a device. The method embodiments comprise providing a device (e.g., a PFET) on a substrate. As discussed above, due to negative bias temperature instability, such a device is subject to performance degradation away from an optimal performance level.

The repair scheme of the present invention removes the bias and applies a current (e.g., a transmission line pulse) with a predetermined value to an on-chip heating element adjacent to the device so as to locally heat the device to a predetermined temperature sufficient to raise the current performance level of the device. Application of the current to the heating element can be manual or automatic and can occur, for example, after production of the chip package prior to shipment and/or in the field according to a pre-set service schedule. Application of the current to the heating element can also be initiated, as necessary, based on performance monitoring. Specifically, another embodiment of the method can further include monitoring the device with an on-chip monitor in order to determine when the current performance level of the device is below a predetermined threshold performance level. When the current performance level is below the predetermined threshold performance level, current is automatically applied to the heating element.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
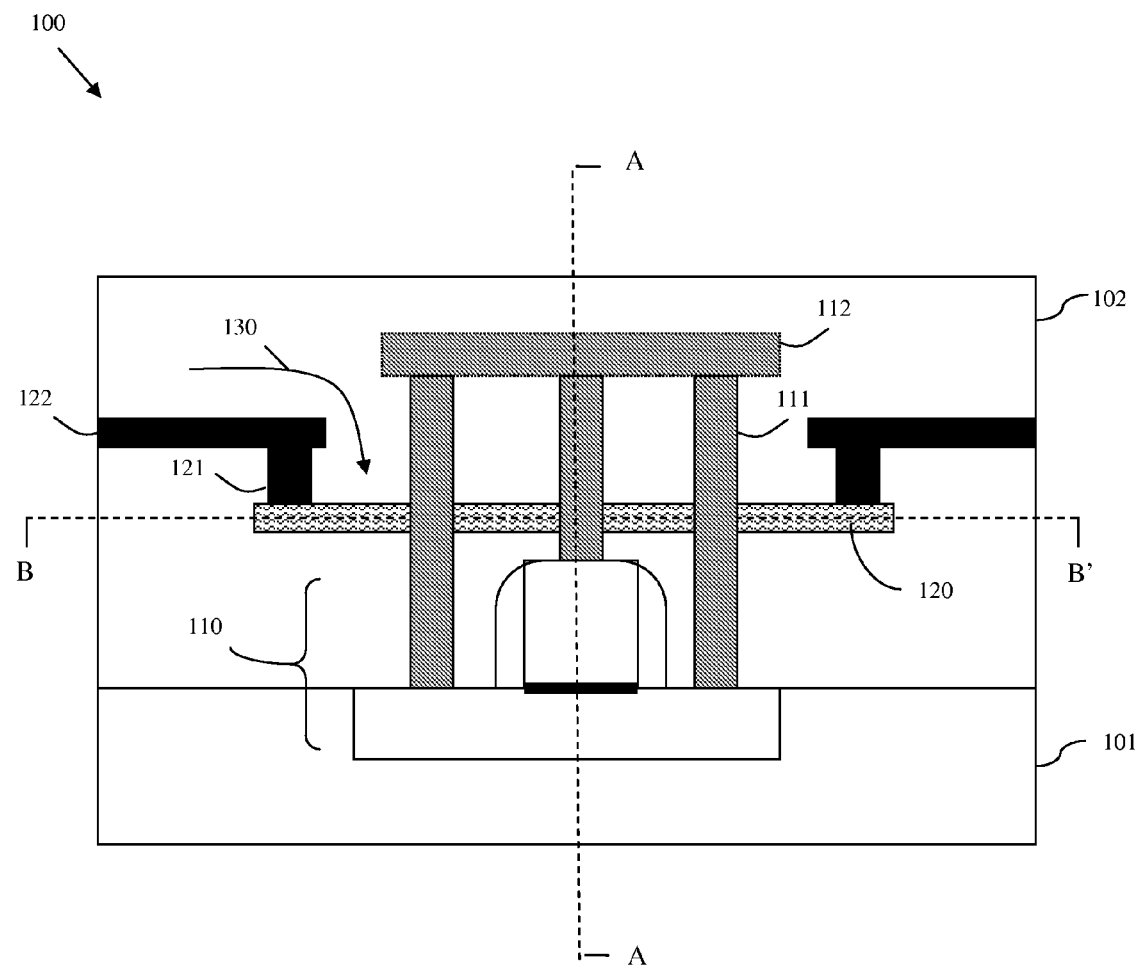
FIG. 1 is a cross-section diagram A-A' illustrating an embodiment of the semiconductor chip structure 100 of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Negative bias temperature instability (NBTI) is a phenomenon in which powered-up sub-micron complementary metal oxide semiconductor (CMOS) devices and, more specifically, p-type field effect transistors (PFETs), exhibit performance degradation over time and/or under certain use conditions. This NBTI primarily changes the chemical properties of the PFET at the silicon-oxide interface causing an increase in the threshold voltage and, thereby causing a reduction in the PFET drive current. One known repair solution is to remove the bias and let the PFET device rest for a period of time on the order of days or even months until the chemical properties revert back. However, allowing devices to undergo such a significant rest period limits the chip usefulness or requires duplicate devices to be incorporated into the chip structure. Consequently, there is a need in the art for semiconductor chip structure and a method that allows for localized, on-chip, repair of devices suffering from NBTI performance degradation.

In view of the foregoing, disclosed herein are embodiments of a semiconductor chip structure and a method that incorporate a localized, on-chip, repair scheme for devices that exhibit performance degradation as a result of negative bias temperature instability (NBTI). The repair scheme utilizes a heating element above each device. The heating element is configured so that it can receive transmission line pulses and, thereby generate enough heat to raise the adjacent device to a temperature sufficient to allow for performance recovery. Specifically, high temperatures (e.g., between approximately 300-400° C. or greater) in the absence of bias can accelerate the recovery process to a matter of seconds as opposed to days or months. The heating element can be activated, for example, on demand, according to a pre-set service schedule, and/or in response to feedback from a device performance monitor.

More particularly, referring to FIG. 1, an embodiment of a semiconductor chip structure 100 of the present invention comprises a substrate 101. This substrate 101 can, for example, comprise a bulk semiconductor wafer, a bulk silicon wafer, a silicon-on-insulator wafer, etc. A semiconductor device 110 is positioned on the substrate 101. This semiconductor device 110 can, for example, comprise a p-type field effect transistor (PFET). The PFET can comprise a conventional planar PFET, as illustrated. That is, the PFET source/drain regions and channel region can be formed within the semiconductor substrate 101 and a gate structure (i.e., a gate dielectric-gate conductor stack) can be formed on the top surface of the semiconductor substrate 101 adjacent to the PFET channel region. However, it should be understood that the semiconductor device 110 can, alternatively, comprise a different type of PFET structure (e.g., a fin-type PFET, a tri-gate PFET, a multi-gate PFET, a PFET with raised source/drain regions, etc.). This semiconductor device 110 is electrically connected to a first back end of the line (BEOL) wiring level 112 (e.g., any one of the metallization layers M1-MX) by first contacts. Due to negative bias temperature instability (NBTI), this device 110 is subject to performance degradation away from an optimal performance level. For example, as a result of aging and use conditions, the device 110 may exhibit an increase in threshold voltage (Vt) and, thereby a reduction in the PFET drive current. The reduction in PFET drive current results in a corresponding reduction in the optimal operating frequency (e.g., from an operating frequency in the GHz range, such as ≈1 GHz, to an operating frequency in the MHz range, such as ≈900 MHz).

The repair scheme of the present invention uses a heating element 120 positioned adjacent to the device 110 and, more particularly, above the device 110 such that at least of a portion of the heating element 120 extends between the device 110 and the first BEOL wiring level 112. This heating element 120 can, for example, comprise a BEOL resistor in the form of a metal or metal alloy layer, such as, a refractory metal (e.g., tantalum (Ta), tungsten (W), molybdenum (Mo), niobium (Nb), or Rhenium (Re)) or a refractory metal alloy (e.g, tantalum nitride (TaN), etc.), having a melting temperature that is at least greater than approximately 400° C. This heating element 120 is adapted to receive a current 130 with a predetermined value so as to locally heat (i.e., anneal) the device 110 to a predetermined temperature, which is sufficient to raise the current performance level of the device 110 (e.g., to return the device 110 to the optimal performance level or close thereto). For example, activation of the heating element 120 can be used to decrease the threshold voltage (Vt) of the device 110 and, thereby causes an increase the drive current of the device 110 so that the device operates at or near the optimal operating frequency. It should be noted that prior to the repair anneal, bias is removed from the device 110.

Figure 2:
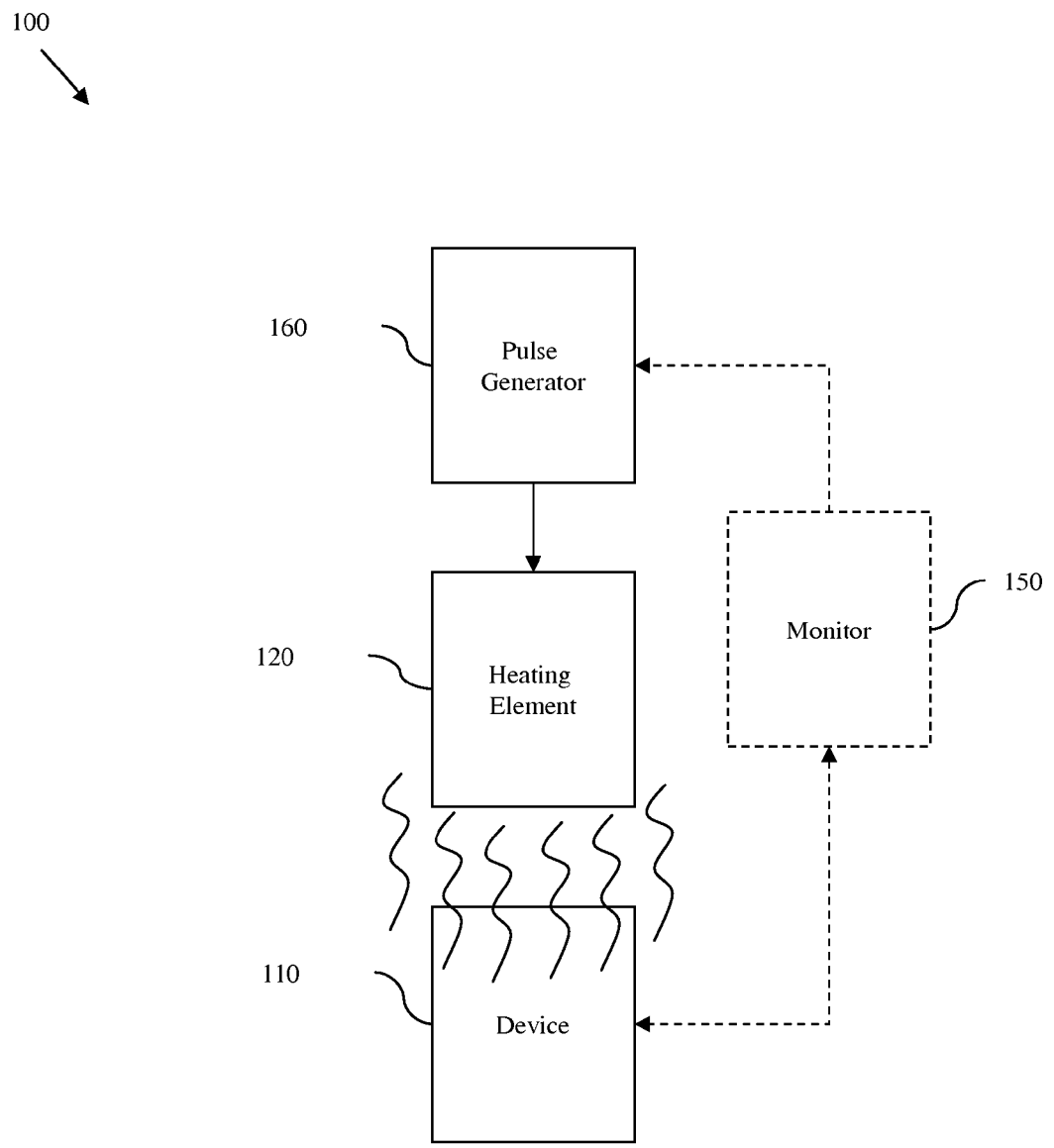
FIG. 2 is a schematic block diagram further illustrating the semiconductor chip structure 100.
Figure 5:
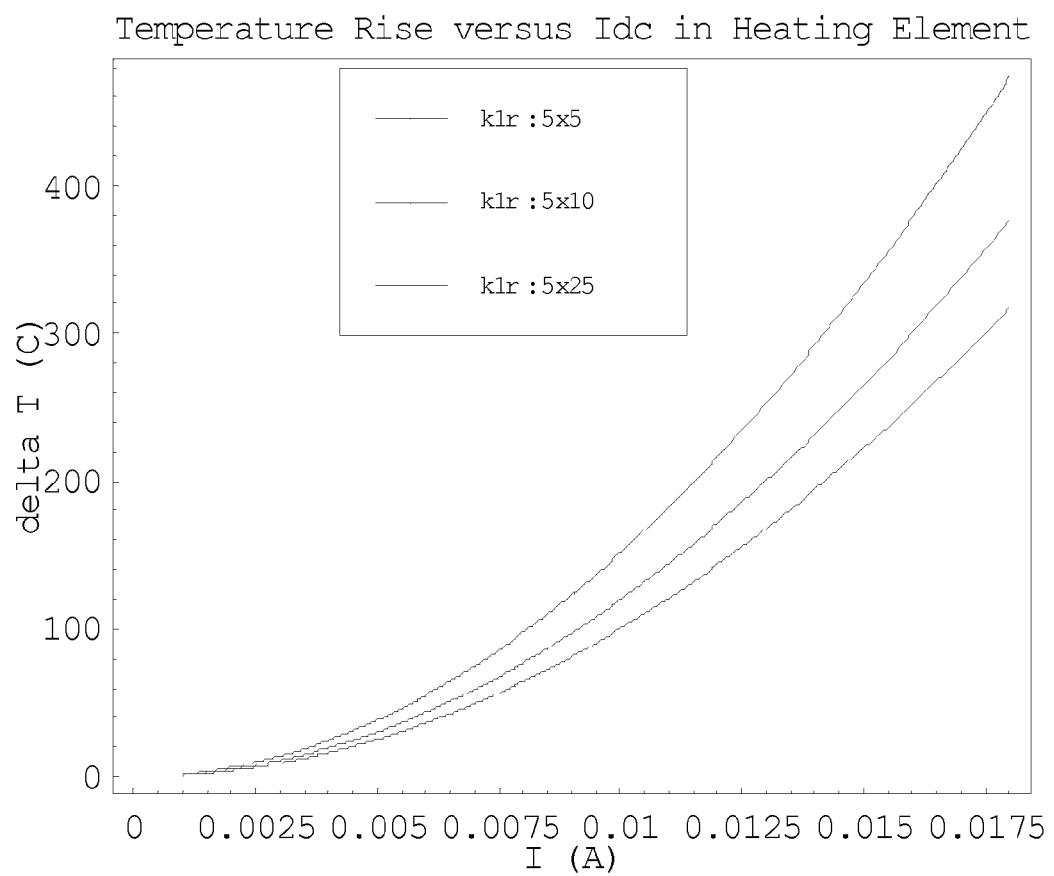
FIG. 5 is a graph illustrating a relationship between a current value applied to an exemplary heating element to the resulting change in temperature of the device (i.e., delta T in ° C.)
Figure 6:
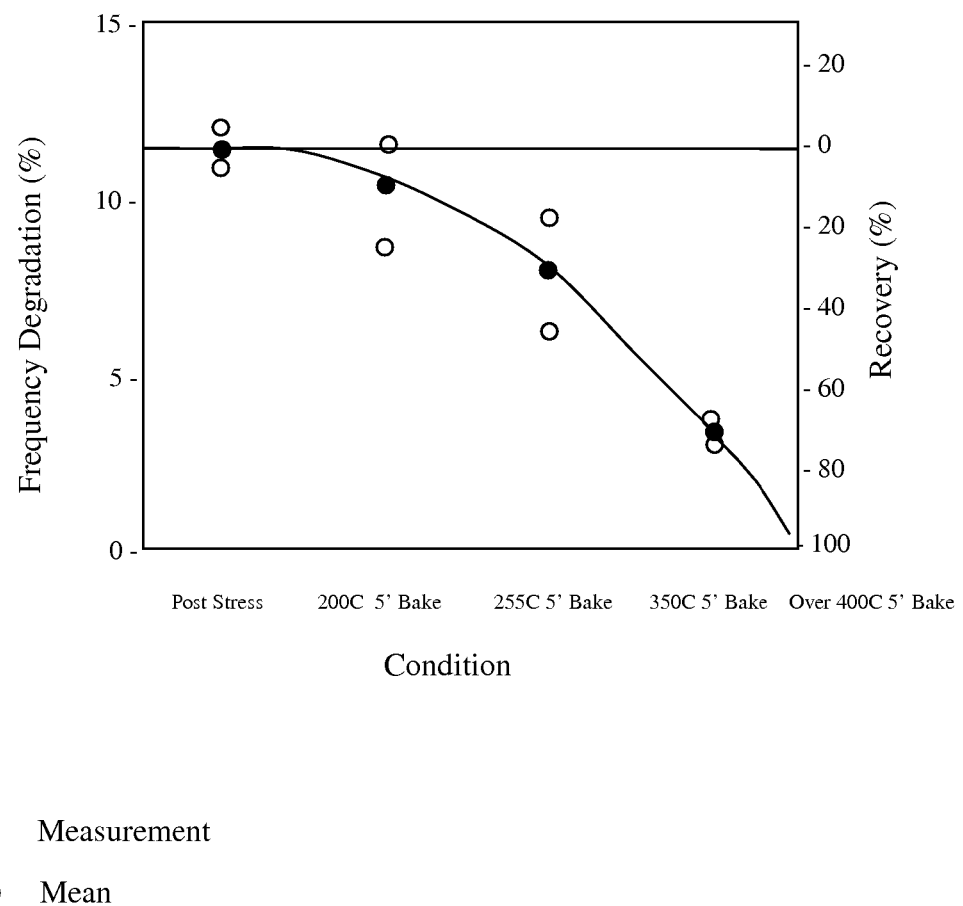
FIG. 6 is a graph illustrating a relationship between the repair anneal conditions and performance recovery.

Referring to FIG. 2 in combination with FIG. 1, in order to accomplish this, a transmission line pulse device 160 (i.e., a pulse generator or pulser) can be coupled to the heating element 120 through a second BEOL wiring level 122, which is different from the first BEOL wiring level 112, and through one or more second contacts 121 extending between the second wiring level 122 and the heating element 120. The transmission line pulse device 160 can comprise a conventional transmission line pulse device 160 and can be adapted to apply a DC current 130 in the form of a transmission line pulse to the heating element 120. Application of high temperatures (e.g., application of temperatures over the ≈125° C. operating temperature of most applications and, more particularly, of temperatures between ≈300-400° C. or greater) to the device 110 in the absence of bias can accelerate the recovery process to a matter of seconds (e.g., ≈10 seconds or less) as opposed prior art techniques which required days or months for recovery. FIG. 5 is a graph illustrating a relationship between a DC current value applied by a TLP generator 160 to an exemplary heating element 120 to the resulting change in temperature of the device 110 (i.e., delta T in ° C.). As illustrated, current values of 0.0175 amps or greater can result in device temperature changes of greater than approximately 300° C. FIG. 6 is a graph illustrating the relationship between the on-chip repair anneal conditions (i.e., the temperature to which the device 110 is heated and the length of time it is held at that temperature) and performance recovery. For example, as illustrated, a 5 second-350° C. bake can result in an approximately 80% recovery and a 5 second-at temperatures over 400° C. can result in an approximately 100% recovery.

Figure 3:
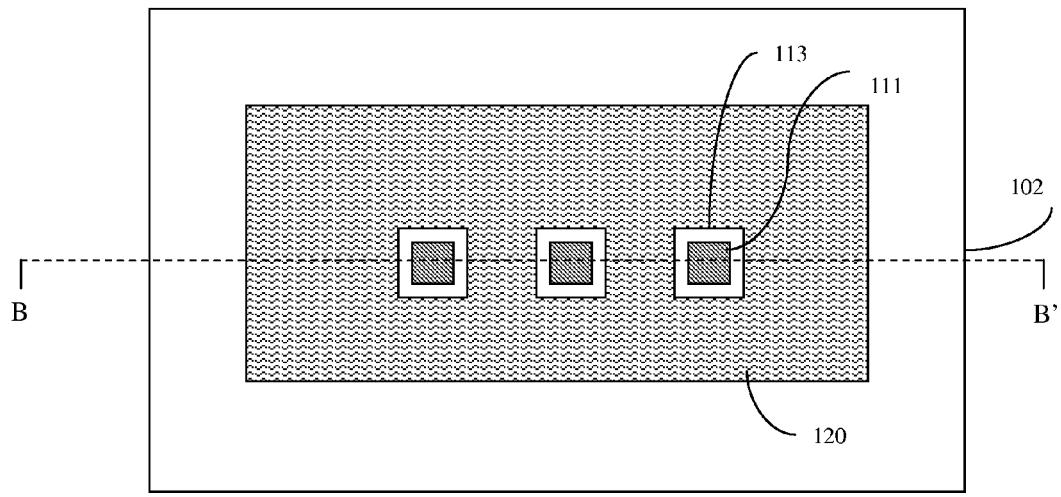
FIG. 3 is a cross-section diagram B-B' further illustrating the semiconductor chip structure 100.
Figure 4:
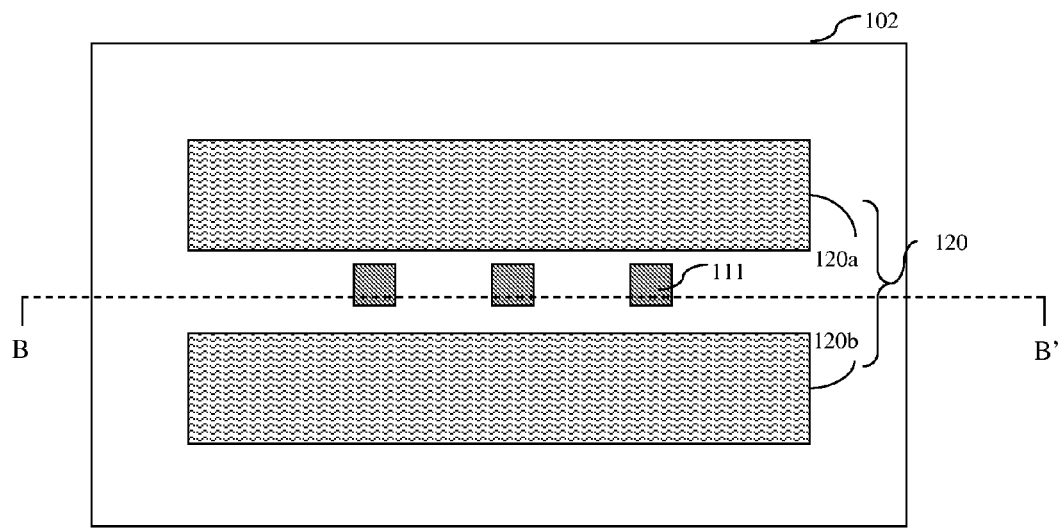
FIG. 4 is an alternative cross-section diagram B-B' further illustrating the semiconductor chip 100.

Those skilled in the art will recognize that the heating element 120 should be physically separated from the second wiring level 122 by a distance sufficient to minimize heat conduction through the second wiring level 122. Additionally, the heating element 120 should be electrically isolated (e.g., by interlayer dielectric material 102, such as silicon dioxide ($SiO_2$)) from the device 110 as well as from the first contacts 111 and the first wiring level 112. For example, referring to the cross-section diagrams B-B' of FIGS. 3 and 4, the heating element 120 may have dielectric filled openings through which the first contacts 111 to the device 110 may pass or may be segmented (see segments 120a-b) into shapes between which the first contacts 111 to the device 110 may pass.

Activation of the heating element 120 can be manual or automatic. For example, activation of the heating element 120 can be initiated immediately after package 100 production prior to shipment and/or in the field according to a pre-set service schedule. Activation of the heating element 120 can also be initiated, as necessary, based on performance monitoring. Specifically, referring again to FIG. 2 in combination with FIG. 1, another embodiment of the semiconductor chip structure 100 can comprise a performance degradation monitor 150 in addition to the features set out above. This performance degradation monitor 150 can comprise, for example, a monitoring circuit similar to the circuit for tracking transistor stress degradation described in detail in U.S. Pat. No. 6,879,177 of Bolam et al. issued on Apr. 12, 2005 and incorporated herein by reference. Specifically, this monitor 150 can be connected to the device 110 and can be adapted to detect the current performance level of the device 110 and further to determine if the current performance level is below a predetermined threshold performance level. The monitor 150 can be in communication with the transmission line pulse device 160 and the transmission line pulse device 160 can further be adapted to apply the current 130 (i.e., to apply the transmission line pulse) to the heating element 120 when the monitor 150 detects that the current performance level is below the predetermined threshold level.

Figure 7:
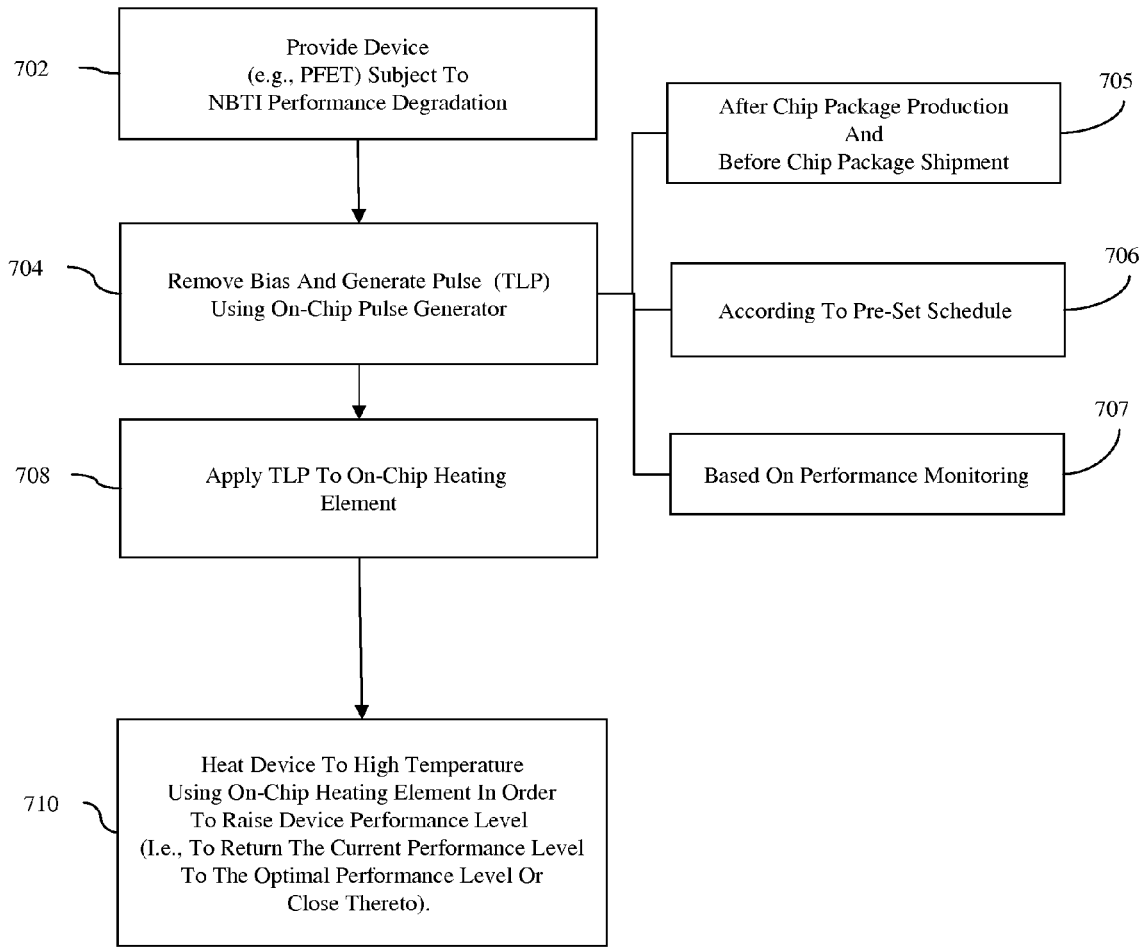
FIG. 7 is a flow diagram illustrating an embodiment of a method of the present invention.

Referring to FIG. 7 in combination with FIG. 1, also disclosed are embodiments of an associated method for the on-chip repair of a device 110. The method embodiments comprise providing a device 110 (e.g., a PFET) on a substrate 101 (702). As discussed in detail above, due to negative bias temperature instability, such a device 110 is subject to performance degradation away from an optimal performance level. For example, as a result of aging and use conditions, the device 110 may exhibit an increase in threshold voltage and, thereby a decrease in the drive current.

The repair scheme (i.e., process steps 704-710) of the present invention removes the bias from the device 110 and applies a current 130 (e.g., a transmission line pulse) with a predetermined value to an on-chip heating element 120 adjacent to (e.g., above) the device 110 so as to locally heat (i.e., anneal) the device 110 to a predetermined temperature sufficient to raise the performance level of the device 110 (e.g., to return the device 110 to its optimal performance level or close thereto). Application of the current 130 to the heating element 120 can be manual or automatic and can occur, for example, after production of the chip package prior to shipment (705) and/or in the field according to a pre-set service schedule (706). Application of the current to the heating element 120 can also be initiated, as necessary, based on performance monitoring (707). Specifically, another embodiment of the method can further include monitoring the device with an on-chip monitor in order to determine when a current performance level of the device is below a predetermined threshold performance level. Current 130 is automatically applied to the heating element 120 when the current performance level is below the predetermined threshold performance level.

Figure 8:
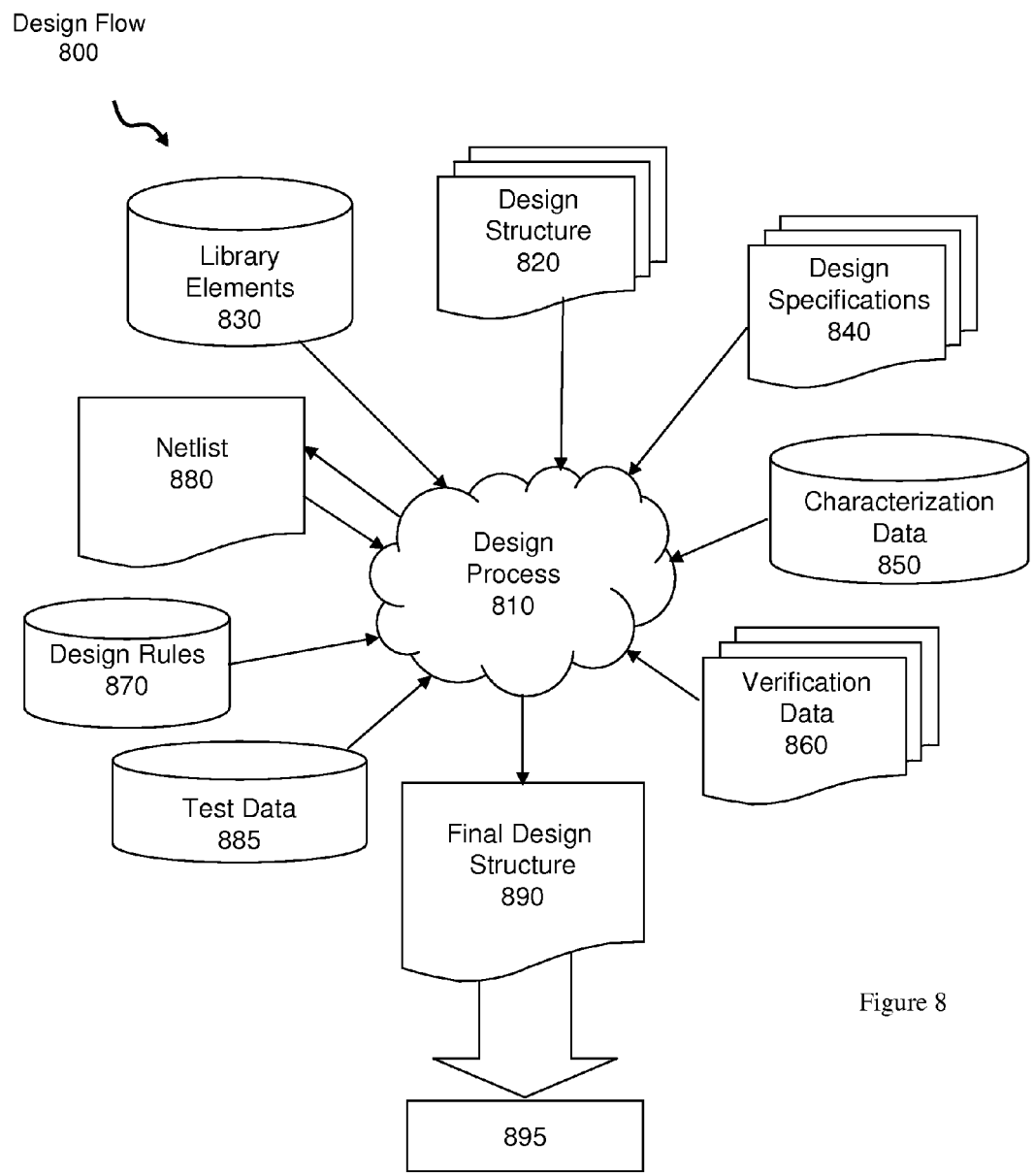
FIG. 8 is a flow diagram of a design process used in semiconductor design, manufacture, and/or test.

FIG. 8 shows a block diagram of an exemplary design flow 800 used for example, in semiconductor design, manufacturing, and/or test. Design flow 800 may vary depending on the type of IC being designed. For example, a design flow 800 for building an application specific IC (ASIC) may differ from a design flow 800 for designing a standard component or from a design from 800 for instantiating the design into a programmable array, for example a programmable gate array (PGA) or a field programmable gate array (FPGA) offered by Altera® Inc. or Xilinx® Inc. Design structure 820 is preferably an input to a design process 810 and may come from an IP provider, a core developer, or other design company or may be generated by the operator of the design flow, or from other sources. Design structure 820 comprises an embodiment of the invention as shown in FIGS. 1-4 in the form of schematics or HDL, a hardware-description language (e.g., Verilog, VHDL, C, etc.). Design structure 820 may be contained on one or more machine readable medium. For example, design structure 820 may be a text file or a graphical representation of an embodiment of the invention as shown in FIGS. 1-4. Design process 810 preferably synthesizes (or translates) an embodiment of the invention as shown in FIGS. 1-4 into a netlist 880, where netlist 880 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Design process 810 preferably translates an embodiment of the invention as shown in FIGS. 1-4, along with any additional integrated circuit design or data (if applicable), into a second design structure 890. Design structure 890 resides on a storage medium in a data format used for the exchange of layout data of integrated circuits and/or symbolic data format (e.g. information stored in a GDSII (GDS2), GLI, OASIS, map files, or any other suitable format for storing such design structures). Design structure 890 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-4. Design structure 890 may then proceed to a stage 895 where, for example, design structure 890: proceeds to tape-out, is released to manufacturing, is released to a mask house, is sent to another design house, is sent back to the customer, etc.

Therefore, disclosed above are embodiments of a semiconductor chip structure and a method that incorporate a localized, on-chip, repair scheme for devices that exhibit performance degradation as a result of negative bias temperature instability (NBTI). The repair scheme utilizes a heating element above each device. The heating element is configured so that it can receive transmission line pulses and, thereby generate enough heat to raise the adjacent device to a temperature sufficient to allow for performance recovery. Specifically, high temperatures (e.g., between approximately 300-400° C. or greater) in the absence of bias can accelerate the recovery process to a matter of seconds as opposed to days or months. The heating element can be activated, for example, on demand, according to a pre-set service schedule, and/or in response to feedback from a device performance monitor.

This invention provides the advantage of, not only of in the field recovery, but also elimination of the need for a performance guardband prior to product shipment. Thus, the embodiments of the invention provide a significant benefit for semiconductor products requiring high reliability. Specifically, semiconductor products which require a high degree of reliability are typically subjected to a burn-in treatment prior to customer shipment. The purpose of this burn-in treatment is to accelerate defect mechanisms to the point of failure so that any failing product samples are discarded prior to customer shipment. Typical burn-in treatments are performed at higher than normal operating conditions (i.e., at an elevated voltage and an elevated temperature). These burn-in conditions also accelerate the NBTI mechanism, which as discussed in above, results in product performance reduction. By applying the disclosed on-chip repair scheme after the burn-in treatment, the invention can repair any performance loss resulting from the burn-in process itself prior to customer shipment. In addition, subsequent on-chip repairs can be used to recover performance loss as a result of NBTI during operation, thereby avoiding the need to replace semiconductor products incorporated into systems.

The foregoing description of the specific embodiments will so fully reveal the general nature of the invention that others can, by applying current knowledge, readily change, modify and/or adapt for various applications such specific embodiments without departing from the generic concept, and, therefore, such changes, modifications, and/or adaptations should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with changes, modifications and/or adaptations within the spirit and scope of the appended claims.

What is claimed is:

1. A system comprising:
a non-transitory computer readable medium with a design structure stored therein; and
a machine for manufacturing a semiconductor chip comprising instructions that when executed by a computer retrieves said design structure and produces said semiconductor chip, wherein said design structure comprises:
a substrate;
a device on said substrate;
an interlayer dielectric material above said device; and
a heating element within said interlayer dielectric material, aligned vertically above said device and electrically isolated from said device by said interlayer dielectric material, said heating element, upon detection of performance degradation of said device, receiving a current with a predetermined value and generating heat that raises a temperature of said device to a predetermined temperature sufficient to raise a current performance level of said device to a predetermined threshold performance level,
said device being electrically connected by a first contact to a first wiring level and said heating element being above said device and electrically connected by a second contact to a second wiring level.

2. The system of claim 1, said heating element comprising a back end of the line (BEOL) resistor.

3. The system of claim 1, said heating element having a melting temperature that is greater than approximately 400° C. and comprising at least one of a metal and a metal alloy.

4. The system of claim 1, said heating element comprises one of a refractory metal and a refractory metal alloy.

5. The system of claim 1, said heating element being physically separated from said second wiring level by a distance sufficient to minimize heat conduction through said second wiring level and said heating element being further isolated from said first contact and said first wiring level.

6. The system of claim 1, said device comprising a p-type metal oxide semiconductor field effect transistor.

7. The system of claim 1, further comprising a transmission line pulse device coupled to said heating element through said second wiring level and said second contact, said transmission line pulse device being adapted to apply said current to said heating element in the form of a transmission line pulse.

8. The system of claim 1, said design structure comprising a netlist.

9. The system of claim 1, said design structure residing on a storage medium as a data format used for the exchange of layout data of integrated circuits.

10. The system of claim 1, said design structure residing in a programmable gate array.

11. A system comprising:
- a non-transitory computer readable medium with a design structure stored therein; and
- a machine for manufacturing a semiconductor chip comprising instructions that when executed by a computer retrieves said design structure and produces said semiconductor chip, wherein said design structure comprises:
- a substrate;
- a transistor on said substrate, wherein, due to negative bias temperature instability, said transistor is subject to performance degradation away from an optimal performance level;
- a monitor connected to said transistor and determining when a current performance level of said transistor is below a predetermined threshold performance level for said transistor;
- an interlayer dielectric material above said transistor;
- a heating element within said interlayer dielectric material, aligned vertically above said transistor and electrically isolated from said transistor by said interlayer dielectric material;
- a first wiring level within said interlayer dielectric material and above said heating element;
- a first contact electrically connecting said first wiring level to said transistor, said first contact extending vertically through said heating element and further being electrically isolated from said heating element by said interlayer dielectric material; and
- a pulse generator in communication with said monitor and coupled to said heating element, said pulse generator automatically applying a current with a predetermined value to said heating element when said monitor detects that said current performance level of said transistor is below said predetermined threshold performance level,
- said heating element receiving said current from said pulse generator and generating heat that raises a temperature of said transistor to a predetermined temperature, said predetermined temperature being sufficient to raise said current performance level of said transistor above said predetermined threshold performance level.

12. The system of claim 11, said heating element comprising a back end of the line (BEOL) resistor.

13. The system of claim 11, said heating element having a melting temperature that is greater than approximately 400° C. and comprising at least one of a metal and a metal alloy.

14. The system of claim 11, said heating element comprising at least one of a refractory metal and a refractory metal alloy.

15. The system of claim 11,
- said heating element extending laterally beyond source/drain regions of said transistor, and
- said semiconductor chip further comprising:
  - a second wiring level different from said first wiring level; and
  - second contacts at opposing ends of said heating element and extending vertically through said interlayer dielectric material to said second wiring level.

16. The system of claim 15, said heating element being physically separated from said second wiring level by a distance sufficient to minimize heat conduction through said second wiring level and said heating element further being isolated from said first contact and said first wiring level.

17. The system of claim 11, said design structure comprising a netlist.

18. The system of claim 11, said design structure residing on a storage medium as a data format used for the exchange of layout data of integrated circuits.

19. The system of claim 11, said design structure residing in a programmable gate array.

* * * * *